United States Patent
Odedra et al.

(10) Patent No.: US 11,498,938 B2
(45) Date of Patent: Nov. 15, 2022

(54) ORGANOMETALLIC COMPOUNDS USEFUL FOR CHEMICAL PHASE DEPOSITION

(71) Applicant: SEASTAR CHEMICALS ULC, Sidney (CA)

(72) Inventors: Rajesh Odedra, Altrincham (GB); Cunhai Dong, Victoria (CA); Shaun Cembella, Victoria (CA)

(73) Assignee: SEASTAR CHEMICALS ULC, Sidney (CA)

(*) Notice: Subject to any disclaimer, the term of this patent is extended or adjusted under 35 U.S.C. 154(b) by 0 days.

(21) Appl. No.: 17/010,558

(22) Filed: Sep. 2, 2020

(65) Prior Publication Data

US 2020/0399300 A1 Dec. 24, 2020

Related U.S. Application Data (62) Division of application No. 15/569,957, filed as application No. PCT/CA2016/050481 on Apr. 25, 2016, now abandoned.

(Continued)

(51) Int. Cl.
*C07F 15/06* (2006.01)
*C23C 16/18* (2006.01)
(Continued)

(52) U.S. Cl.
CPC ............ *C07F 15/06* (2013.01); *C07F 11/00* (2013.01); *C07F 13/00* (2013.01); *C07F 15/02* (2013.01);
(Continued)

(58) Field of Classification Search
CPC .................. C23C 16/18; C23C 16/45553
See application file for complete search history.

(56) References Cited

U.S. PATENT DOCUMENTS 7,135,207 B2* 11/2006 Min .................. C23C 16/45553
427/255.36
2009/0208637 A1* 8/2009 Chen ...................... C07F 15/06
546/10

(Continued)

FOREIGN PATENT DOCUMENTS

WO  WO-2014118748 A1  8/2014
WO  WO-2014118750 A1  8/2014

OTHER PUBLICATIONS

Abakumov et al., "Infrared study of the interaction between carbonyl complexes of manganese, iron, cobalt, and rhenium and bisorganometallic derivatives of mercury", Metalloorganicheskaya Khimiya, vol. 5, No. 4, pp. 941-945 (1992) (Abstract in English).

(Continued)

*Primary Examiner* — Kelly M Gambetta
(74) *Attorney, Agent, or Firm* — Faegre Drinker Biddle & Reath LLP (57) ABSTRACT

A method for forming a metal-containing film includes: a) providing at least one substrate; b) delivering to said substrate at least one compound of Formula 1 in the gaseous phase, $(R^1R^2R^3(Si))$—$Co(CO)_4$ (Formula 1), wherein $R^1$, $R^2$ and $R^3$ are independently selected lower alkyl groups; and c) simultaneously with or subsequently to step b), delivering to said substrate a co-reagent in the gaseous phase, the co-reagent being lower alcohol. Further, a method of selectively depositing a metal-containing film includes: a) providing at least two substrates comprising different materials, one of said at least two substrates has an affinity for Si and another of said at least two substrates has an affinity for CO; b) delivering to said substrates at least one compound of the Formula 1 in the gaseous phase; and c) simultaneously with or subsequently to step b), delivering to said at least two substrates at least one co-reagent in the gaseous phase.

14 Claims, 12 Drawing Sheets

Related U.S. Application Data (60) Provisional application No. 62/154,896, filed on Apr. 30, 2015.

(51) Int. Cl.
*C23C 16/455* (2006.01)
*C07F 15/02* (2006.01)
*C07F 11/00* (2006.01)
*C07F 13/00* (2006.01)

(52) U.S. Cl.
CPC ........ *C23C 16/18* (2013.01); *C23C 16/45553* (2013.01)

(56) References Cited

U.S. PATENT DOCUMENTS

| | | | | |
|---|---|---|---|---|
| 2009/0269507 | A1* | 10/2009 | Yu | H01L 21/2855 427/535 |
| 2016/0010204 | A1* | 1/2016 | Gatineau | C23C 16/45525 427/569 |
| 2016/0064275 | A1* | 3/2016 | Liu | H01L 21/28562 438/608 |

OTHER PUBLICATIONS

Audet (née Christie et al.), "Transition-metal carbonyl derivatives of the Germanes. Part 18. Tetracarbonylbis (permethylgermyl)iron compounds [Fe(CO)4(GeMe3-xHx)]—(GeMe3-yHy)] for x,y = 0-3", Journal of the Chemical Society, Dalton Transactions: Inorganic Chemistry, (1972-1999)(1988), (10), pp. 2635-2643.

Carey et al., "Reactivity of metal-metal bonds. IV. Reaction of sulfur dioxide with compounds containing tSn—Sn and Mn bonds", Canadian Journal of Chemistry, vol. 46, No. 4, pp. 643-647 (1968).

Delbeke et al., "Transition metal chemistry. VI. Calculation of force constants in the CO stretching region of cis-disubstituted Group VI metal carbonyls and iron carbonyl complexes with C2v symmetry", Journal of Organometallic Chemistry, vol. 25, No. 1, pp. 219-222 (1970).

Webb et al., "Novel carbene complexes from triphenyl- and trimethylgermylpentacarbonylmanganese", Journal of Organometallic Chemistry, vol. 59, pp. C21-C23 (1973).

Yempally et al. (cited in ISR as Veerana et al.), "Synthesis and characterization of bimetallic nickel and cobalt carbonyl complexes containing stannyl groups", Journal of Cluster Science, vol. 21, No. 3, pp. 417-426 (2010).

ISR dated Nov. 3, 2016 (corresponding International Appl. No. PCT/CA2016/050481).

Extended European search report issued in European patent application No. 16 785 706.9, dated Nov. 14, 2018.

Attila, Sisak et al. "Alkylcobalt carbonyls. 9. Alkoxy-, silyloxy-, and hydroxy-substituted methyl-and acetylcobalt carbonyls. Reduction of formaldehyde to methanol by hydridocobalt tetracarbonyl", Organometallics, vol. 8, No. 4, Apr. 1, 1989 (Apr. 1, 1989), pp. 1096-1100, XP055521200, US ISSN: 0276-7333,DOI:10.1021/om00106a035.

First Chinese Office Action dated Aug. 30, 2019 issued in Chinese patent application No. 2016800294106.

First Taiwanese Office Action dated Apr. 15, 2020 issued in Taiwan (R.O.C.) patent application No. 105113264.

* cited by examiner

ORGANOMETALLIC COMPOUNDS USEFUL FOR CHEMICAL PHASE DEPOSITION

This is a Divisional Application of U.S. application Ser. No. 15/569,957, filed Oct. 27, 2017, which is the PCT National Stage of International Application No. PCT/CA2016/050481, filed Apr. 25, 2016, which claims priority to U.S. Provisional No. 62/154,896, filed Apr. 30, 2015, each of which are herein incorporated by reference in their entirety.

FIELD

The invention relates to compounds formed from metal carbonyl complexes with trialkyl silyl, germanyl or stannyl ligands, and to methods of preparing thin films of substantially pure metal, alternatively films of metal alloys, metal oxides, nitrides, phosphides, borides or sulphides by chemical vapor deposition (CVD) or atomic layer deposition (ALD) using such compounds. Methods of preparing thin films of substantially-pure metal alloys, mixed-metal oxides, mixed-metal nitrides, mixed-metal phosphides, mixed-metal borides or mixed-metal sulphides are also disclosed. Methods of substrate-selective deposition of metal films are also disclosed.

BACKGROUND

Various organometallic compounds are used to form thin metal films on a variety of substrates, and a variety of deposition techniques have been employed to do so. These include reactive sputtering, ion-assisted deposition, sol-gel deposition, CVD, and ALD, also known as atomic layer epitaxy. The CVD and ALD processes are increasingly used as they have the advantages of good compositional control, high film uniformity, good control of doping and, significantly, they give excellent conformal step coverage on highly non-planar microelectronics device geometries.

CVD (also referred to as metal-organic CVD or MOCVD) is a chemical process whereby compounds are used to form a thin film on a substrate. In a typical CVD process, the compounds are passed over a substrate (wafer) within a low pressure or ambient pressure reaction chamber. The compounds react and/or decompose on the substrate surface creating a thin film of deposited material. Volatile by-products are removed by gas flow through the reaction chamber. The deposited film thickness can be difficult to control because it depends on coordination of many parameters such as temperature, pressure, gas flow volumes and uniformity, chemical depletion effects and time.

ALD is a common method for the deposition of thin films. It is a self-limiting, sequential, unique film growth technique based on surface reactions that can provide atomic layer-forming control and deposit-conformal thin films of materials provided by compounds onto substrates of varying compositions. In ALD, the compounds are separated during the reaction. The first compound is passed over the substrate producing a monolayer on the substrate. Any excess unreacted compound is pumped out of the reaction chamber. A second compound is then passed over the substrate and reacts with the first compound, forming a second monolayer of film over the first-formed monolayer of film on the substrate surface. This cycle is repeated to create a film of desired thickness. ALD film growth is self-limited and based on surface reactions, creating uniform depositions that can be controlled at the nanometer-thickness scale.

Deposition of good quality metals by CVD and/or ALD is difficult either due to stability issues of the compounds or impurities in the final films. The stability of the compounds can impact the delivery of these materials to the growth chamber and thus the deposition rate or partial decomposition in the lines. If the compounds cannot decompose or react cleanly, then impurities such as C, N, O and H can incorporate into the film which causes the performance of the film to be less than optimum. The incorporation of impurities in the films may also have some impact on film adhesion to the underlying substrate and thus on the device performance.

The delivery of the compound and the lifetime of the compound in the bubbler are also important and this can be a challenge when solid compounds are involved, thus there is always a desire to use liquid compounds with good stability.

Current compounds for use in CVD and ALD do not provide the required performance to implement new processes for fabrication of next generation devices, such as semiconductors. For example, improved thermal stability, higher volatility, reduced vapor pressures, and increased deposition rates are needed.

This invention is related to compound engineering to meet some of the challenges highlighted above.

Notation and Nomenclature

Certain abbreviations, symbols, and terms are used throughout the following description and claims, and include the following.

As used herein, the term "lower alkyl group" refers to linear, branched, or cyclic alkyl groups having from 1 to 8 carbon atoms. Examples of linear alkyl groups include, without limitation, methyl groups, ethyl groups, propyl groups, and butyl groups. Examples of branched alkyl groups include, without limitation, isopropyl groups and t-butyl groups. Examples of cyclic alkyl groups include, without limitation, cyclopropyl groups, cyclopentyl groups, and cyclohexyl groups.

The term "lower alcohol" refers to a primary, secondary or tertiary alcohol having from 1 to 4 carbon atoms. Examples of such alcohols include, without limitation, methanol, ethanol, isopropanol and tertiary butanol.

The term "lower alkyl amine" refers to a primary or secondary amine having lower alkyl group(s) each having from 1 to 4 carbon atoms. Examples of such amines include, without limitation, methylamine, ethylamine, di-isopropylamine and tertiarybutylamine.

The term "substituted hydrazine" refers to hydrazines having from 1 to 4 substituents which are independently-selected lower alkyl groups, each having from 1 to 4 carbon atoms, or a phenyl group. Examples of such hydrazines include, without limitation, N,N-dimethyl hydrazine, tertiary-butyl hydrazine, methyl hydrazine and phenyl hydrazine.

The term "lower alkyl phosphine" refers to a primary or secondary phosphine having lower alkyl group(s) each having from 1 to 4 carbon atoms. Examples of such amines include, without limitation, methylphosphine, dimethylphosphine, ethylphosphine, and tertiary butylphosphine.

The term "lower alkyl thiol" refers to a primary, secondary or tertiary thiol having from 1 to 4 carbon atoms. Examples of such alcohols include, without limitation, methane thiol, ethane thiol, and tertiary-butyl thiol.

The term "lower alkyl borane" refers to a primary, secondary or tertiary borane, or a precursor thereof, having from 1 to 4 carbon atoms. Examples of such boranes include, without limitation, methyl borane, ethyl borane, and trimethyl borane.

The term "cobalt group metals" refers to the elements Co, Rh, and Ir.

The term "manganese group metals" refers to the elements Mn and Re.

The term "chromium group metals" refers to the elements Cr, Mo, and W.

The term "iron group metals" refers to the elements Fe, Ru, and Os.

As used herein, the term "compound" refers to an organometallic molecule, complex and/or compound which is deposited or delivered to or passed over a substrate to form a thin film by a vapor deposition process such as CVD or ALD.

As used herein, the term "metal-containing film" refers to a film of substantially pure metal, metal oxide, metal nitride, metal sulphide, metal boride or metal phosphide.

As used herein, the term "vapor deposition process" refers to any type of vapor deposition technique such as CVD or ALD. In various embodiments of the invention, CVD may take the form of conventional (pulsed) CVD, liquid injection CVD or photo-assisted CVD. In other embodiments, ALD may take the form of conventional (pulsed) ALD, liquid injection ALD, photo-assisted ALD, plasma-assisted ALD, or plasma-enhanced ALD. Such techniques are well-known in the art.

SUMMARY

In one aspect, the present invention provides an organometallic compound. The compound corresponds in structure to Formula 1:

wherein $R^1$, $R^2$ and $R^3$ are independently selected from the group consisting of H, a lower alkyl group and a phenyl group optionally substituted with at least one independently selected lower alkyl group, with the proviso that at least one of $R^1$, $R^2$ and $R^3$ must be other than H;

M is selected from the group consisting of the cobalt group metals, the iron group metals, the manganese group metals, and the chromium group metals;

A is selected from the group consisting of Si, Ge, and Sn; and wherein:

x=1, y=4, and z=1 when M is selected from the group consisting of a cobalt group metal, x=1, y=5, and z=1 when M is selected from the group consisting of a manganese group metal, x=2, y=4, and z=1 when M is selected from the group consisting of a chromium group metal, and x=2, y=4, and z=1 or, alternatively, x=1, y=4, and z=2 when M is selected from the group consisting of an iron group metal.

The compounds are useful in chemical phase deposition processes such as atomic layer deposition (ALD) and chemical vapor deposition (CVD)

Methods of deposition of metal-containing films are provided, which involve the reaction of the compound with at least one co-reagent to generate metal carbonyl hydrides which decompose cleanly and thermally to form substantially-pure metal films. Alternatively, substantially-pure metal oxide, nitride, phosphide, boride or sulphide films may be prepared by selection of appropriate co-reagents, as described herein.

Use of more than one compound of Formula 1 in the deposition processes disclosed herein results in the deposition of films of substantially-pure metal alloys, mixed-metal oxides, mixed-metal nitrides, mixed-metal phosphides, mixed-metal borides or mixed-metal sulphides.

Methods of selective deposition are also provided, such that metal or metal nitride films are deposited selectively on certain substrates and not on other substrate materials. One such method involves the use of substrate materials having a surface with a strong affinity for the silyl (or germanyl or tin) ligand component of the compound, such that after reaction of the compound with the co-reagent(s) the silyl ligand attaches to the surface having an affinity for Si, inhibiting the deposition of metal on that surface. Such substrate materials having an affinity include $SiO_2$, SiN, TiN, TaN.

An alternative method of selective deposition involves the use of substrate materials having an affinity for CO, such that after reaction of the compound with the co-reagent(s) the metal carbonyl is bound to the surface having such affinity. The metal carbonyl is subsequently dissociated thermally, leaving the metal coating the surface while the CO is removed as gas. Such substrate materials having an affinity for CO include the nickel group metals Ni, Pd, Pt, cobalt group metals Co, Rh, Ir, and iron group metals Fe, Ru, and Os.

DETAILED DESCRIPTION

An organometallic compound is provided. The compound corresponds in structure to Formula 1:

wherein $R^1$, $R^2$ and $R^3$ are independently selected from the group consisting of H, a lower alkyl group and a phenyl group optionally substituted with at least one independently selected lower alkyl group, with the proviso that at least one of $R^1$, $R^2$ and $R^3$ must be other than H;

M is selected from the group consisting of the cobalt group metals, the iron group metals, the manganese group metals, and the chromium group metals;

A is selected from the group consisting of Si, Ge, and Sn; and wherein:

x=1, y=4, and z=1 when M is selected from the group consisting of a cobalt group metal, x=1, y=5, and z=1 when M is selected from the group consisting of a manganese group metal, x=2, y=4, and z=1 when M is selected from the group consisting of a chromium group metal, and x=2, y=4, and z=1 or, alternatively, x=1, y=4, and z=2 when M is selected from the group consisting of an iron group metal.

In various embodiments of the invention, metal carbonyl compounds with trialkyl silyl, germanyl or stannyl ligands, methods of making such compounds and methods of using such compounds, in the presence of appropriate co-reagents, to form substantially-pure metal-containing films, such as, but not limited to, metal, metal phosphide, metal sulphide, metal oxide, metal boride and metal nitride films, are provided.

The use of more than one compound of Formula 1, each having a different value of M, in the deposition processes disclosed herein results in the formation of films of substantially-pure metal alloys, mixed-metal oxides, mixed-metal nitrides, mixed-metal phosphides, mixed-metal borides or mixed-metal sulphides, the nature of the film formed being dependent upon the nature of the co-reagent used, as described herein.

In a first embodiment of the invention the compound corresponds to Formula 1 wherein M is a cobalt group metal and A is Si. Exemplary compounds include $EtMe_2SiCo(CO)_4$, $Et_3SiCo(CO)_4$, $Me_2SiCo(CO)_4$ and $PhMe_2SiCo(CO)_4$.

In a second embodiment of the invention the compound corresponds to Formula 1 wherein M is an iron group metal, A is Si, x=2, y=4, and z=1. Exemplary compounds include $(Et_3Si)_2Fe(CO)_4$.

In a third embodiment of the invention the compound corresponds to Formula 1 wherein M is an iron group metal, A is Si, x=1, y=4, and z=2.

In a fourth embodiment of the invention the compound corresponds to Formula 1 wherein M is a manganese group metal and A is Si. Exemplary compounds include $Et_3SiMn(CO)_5$.

In a fifth embodiment of the invention the compound corresponds to Formula 1 wherein M is a chromium group metals and A is Si. Exemplary compounds include $(PhMe_2Si)_2W(CO)_4$.

Embodiments of the invention include those in which $R^1$, $R^2$ and $R^3$ are independently selected from the group consisting of a lower alkyl group and a phenyl group optionally substituted with at least one independently selected lower alkyl group.

Exemplary compounds include those in which $R^1$, $R^2$ and $R^3$ are independently selected from the group consisting of a lower alkyl group having from 1 to 5 carbon atoms. Other exemplary compounds include those in which at least one of $R^1$, $R^2$ and $R^3$ is a methyl group.

Other exemplary compounds include those in which $R^1$, $R^2$ and $R^3$ are independently selected from the group consisting of a lower alkyl group having from 1 to 4 carbon atoms. Other exemplary compounds include those in which at least one of $R^1$, $R^2$ and $R^3$ is a methyl group Other exemplary compounds include those in which $R^1$, $R^2$ and $R^3$ are independently selected from the group consisting of a lower alkyl group having from 1 to 4 carbon atoms, two of which are methyl group, the third of which is a lower alkyl group having from 3 to 4 carbon atoms.

Figure 1:
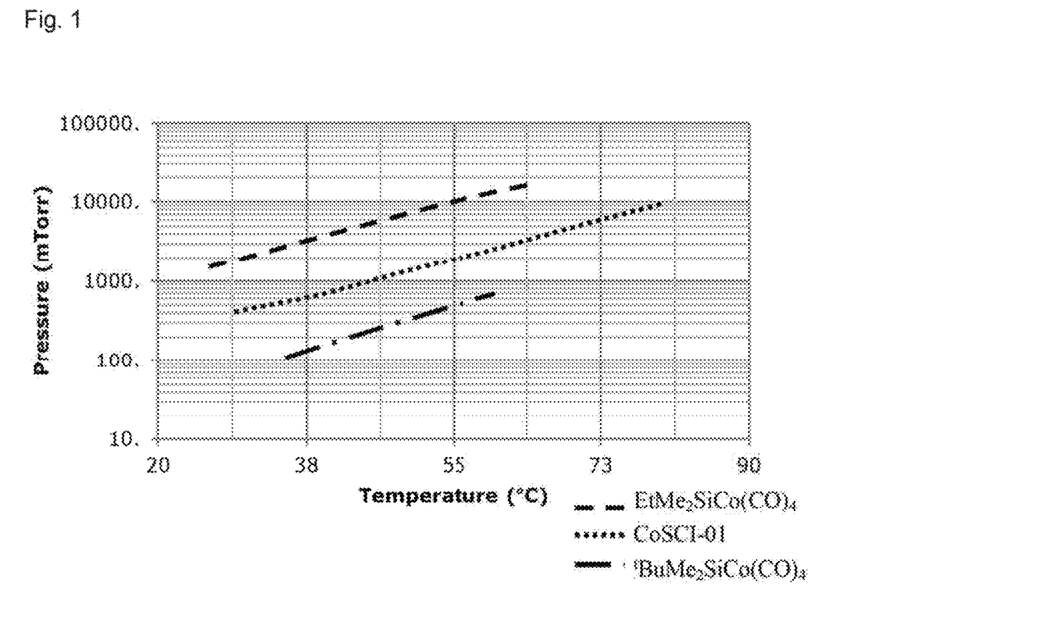
FIG. 1 shows the vapour pressures of compounds of the invention compared to a compound of the art.

Compounds of the invention have improved properties compared to compounds of the art. For example, as shown in FIG. 1, certain compounds of the invention have been shown to be more volatile than a representative compound of the art.

Figure 2:
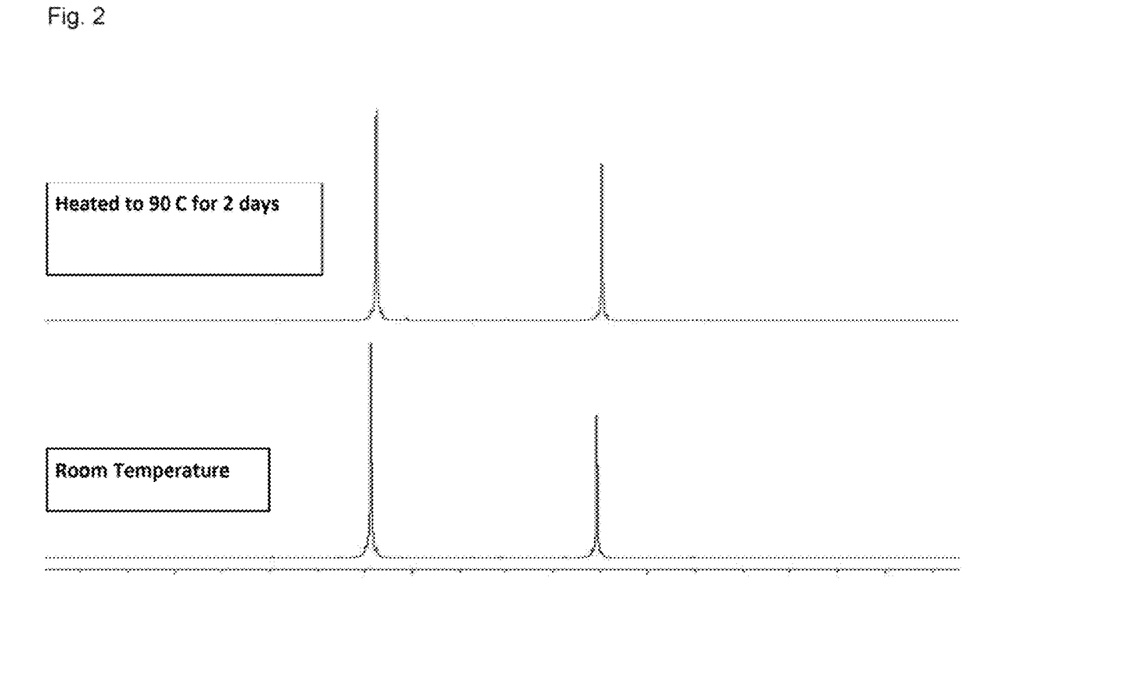
FIG. 2 shows the thermal stability of $^tBuMe_2SiCo(CO)_4$.
Figure 3:
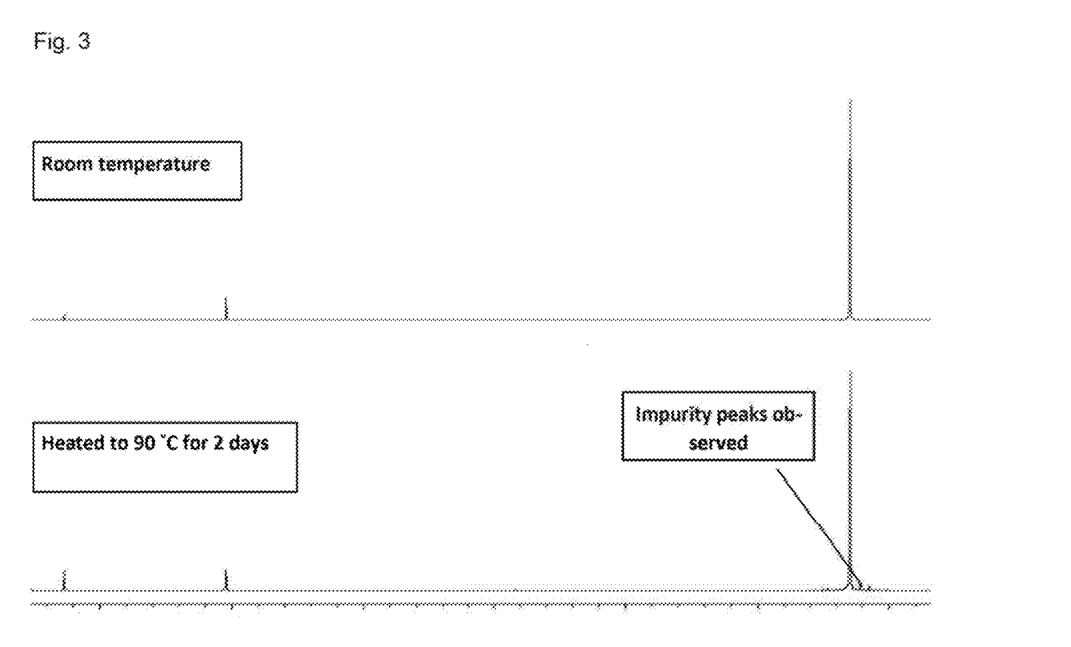
FIG. 3 shows the thermal stability of a compound of the art CCTBA (3,3-Dimethyl-1-butyne)dicobalthexacarbonyl).

Further, as shown in FIG. 2, below, certain compounds of the invention have been shown to be more stable than a representative compound of the art (shown in FIG. 3, below), thus permitting better use (longer lifetime of the material in the container) and also allows for the use of higher temperatures in deposition processes such as CVD and ALD.

The compounds of Formula 1 are useful in chemical phase deposition processes such as atomic layer deposition (ALD) and chemical vapor deposition (CVD).

In further embodiments of the invention, methods of forming metal-containing films by vapor deposition processes are provided. The methods comprise using at least one compound of Formula 1 together with one or more co-reagents, as disclosed herein.

Figure 4:
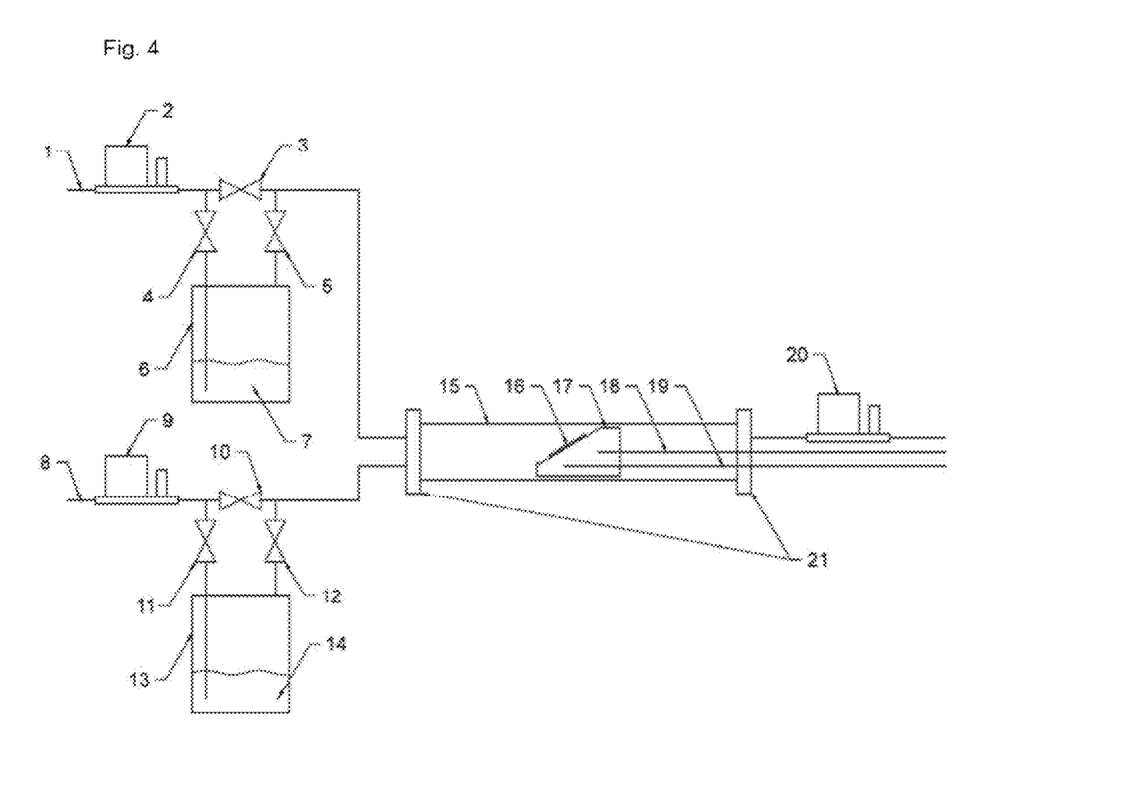
FIG. 4 shows a schematic of a CVD system used for exemplary thin film deposition.

FIG. 4 shows a schematic of a CVD system used for exemplary thin film deposition. An inert carrier gas (1), such as Ar, is passed through a mass flow controller (2) at a controlled flow rate to bubbler (6), which contains a compound of Formula 1 (7) and carries the vaporized compound of Formula 1 to the reaction chamber (15). A liquid co-reagent (14) is delivered to the reaction chamber in a similar fashion, whereas a gaseous co-reagent is delivered directly to the reaction chamber at a controlled flow rate without going through the bubbler. The bubbler may be heated or cooled to obtain a suitable vapor pressure in the desired range. Typically, the temperature of the delivery line is higher than that of the bubbler by about 20 C°, so that the vapor does not condense before reaching reaction chamber. The compound of Formula 1 and the co-reagent are delivered simultaneously. In the reaction chamber, substrate(s) (16) rest on a pre-heated graphite holder (17) at a set temperature controlled by a heater (18) and a thermocouple (19). The pressure in the reaction chamber is controlled by a pressure regulating valve (20), which is connected to a vacuum pump. The delivered compound of Formula 1 and co-reagent react in the reaction chamber, deposit on substrate(s), and so form a thin film. The by-products of the reaction are pumped off under reduced pressure.

For example, in a sixth embodiment of the invention the reaction of a compound of Formula 1 with co-reagents generates metal carbonyl hydrides, which can decompose cleanly and thermally to form substantially pure metal films, while the volatile carbonyl and hydrolyzed trialkyl silyl ligands evaporate and are removed.

For the deposition of substantially pure metal films co-reagents include, but are not limited to, H2, ammonia, a lower alkyl amine, a lower alcohol, hydrazine and a substituted hydrazine.

In a seventh embodiment of the invention the reaction of a compound of Formula 1 with co-reagents generates metal carbonyl oxides, which can decompose cleanly and thermally to form metal oxide films, while the volatile carbonyl and trialkyl silyl ligands evaporate and are removed.

For the deposit of metal oxide films co-reagents include, but are not limited to, $H_2O$, $O_2$, $O_3$, and a lower alcohol.

In an eighth embodiment of the invention the reaction of a compound of Formula 1 with co-reagents generates metal carbonyl amides, which can decompose cleanly and thermally to form metal nitride films, while the volatile carbonyl and trialkyl silyl ligands evaporate and are removed.

For the deposit of metal nitride films co-reagents include, but are not limited to, ammonia, a lower alkyl amine, a lower alcohol, hydrazine and a substituted hydrazine.

In a ninth embodiment of the invention the reaction of a compound of Formula 1 with co-reagents generates metal carbonyl phosphide, which can decompose cleanly and thermally to form metal phosphide films, while the volatile carbonyl and trialkyl silyl ligands evaporate and are removed.

For the deposit of metal phosphide films co-reagents include, but are not limited to, $PH_3$ and a lower alkyl phosphine.

In a tenth embodiment of the invention the reaction of a compound of Formula 1 with co-reagents generates metal carbonyl sulphide, which can decompose cleanly and thermally to form metal sulphide films, while the volatile carbonyl and trialkyl sily ligands evaporate and are removed.

For the deposit of metal sulphide films co-reagents include, but are not limited to, $H_2S$ and a lower alkyl thiol.

In an eleventh embodiment of the invention the reaction of a compound of Formula 1 with co-reagents generates metal carbonyl borides, which can decompose cleanly and thermally to form metal boride films, while the volatile carbonyl and trialkyl silyl ligands evaporate and are removed.

For the deposit of metal boride films co-reagents include, but are not limited to, borane and a lower alkyl borane.

In a further embodiment of the invention, the use of more than one compound of Formula 1, each having a different value of M, in the deposition processes disclosed herein results in the formation of films of substantially-pure metal alloys, mixed-metal oxides, mixed-metal nitrides, mixed-metal phosphides, mixed-metal borides or mixed-metal sulphides, the nature of the film formed being dependent upon the nature of the co-reagent used, as described herein.

For example, in a twelfth embodiment of the invention the use of a cobalt-containing compound of Formula 1 together with a chromium-containing compound of Formula 1 will result in the deposition of a cobalt-chromium alloy.

In further embodiments of the invention, methods of selective deposition are provided such that metal or metal nitride films are deposited selectively on certain substrates and not on other substrate materials.

For example, a thirteenth embodiment of the invention involves the use of substrate materials having a surface with a strong affinity for the silyl (or germanyl or tin, as appropriate) ligand component of the compound of Formula 1 such that, after reaction of the compound of Formula 1 with the co-reagent, the silyl (or germanyl or tin, as appropriate) ligand attaches to the surface having such affinity, inhibiting the deposition of metal on that surface.

Such substrate materials having an affinity include, but are not limited to, $SiO_2$, SiN, TiN, and TaN.

A fourteenth embodiment of the invention involves the use of substrate materials having an affinity for CO such that, after reaction of the compound of Formula 1 with the co-reagent, the metal carbonyl is bound to the surface having such affinity. The metal carbonyl is subsequently dissociated thermally, leaving the metal coating the surface whilst the CO is removed as gas.

Such substrate materials having an affinity for CO include, but are not limited to, the nickel group metals Ni, Pd, Pt, cobalt group metals Co, Rh, Ir, and iron group metals Fe, Ru, and Os.

Figure 5:
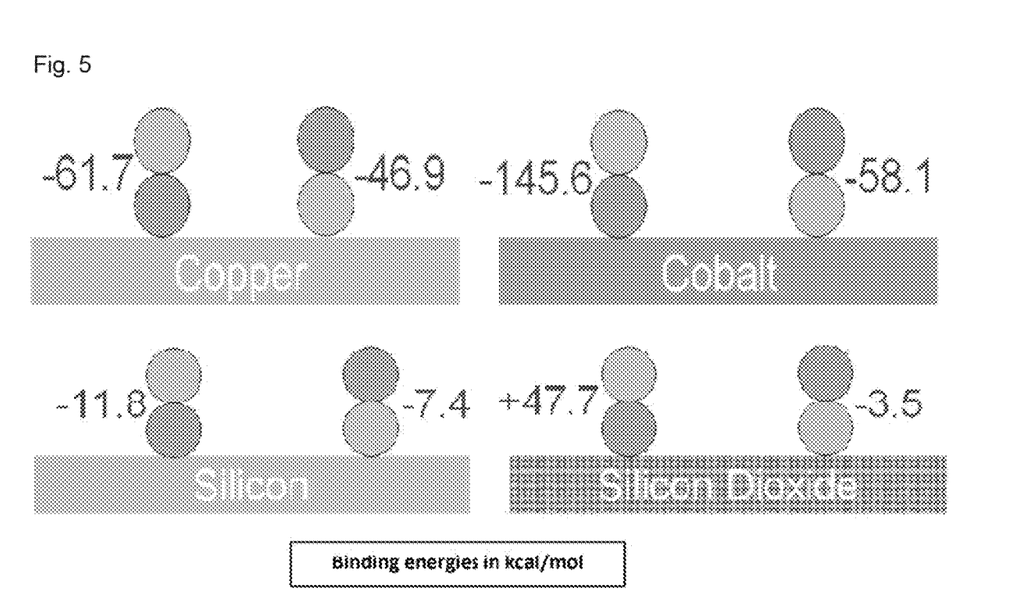
FIG. 5 shows the binding energies of $^tBuMe_2SiCo(CO)_4$ on different surfaces.

FIG. 5 shows the binding energies of $^tBuMe_2SiCo(CO)_4$ to different surfaces. The more negative the energy, the better binding, meaning that the molecule will bind preferentially to Co or Cu, and thus the deposition will preferentially take place on that surface compared to silicon oxide where the binding is weak.

EXAMPLES

Figure 6:
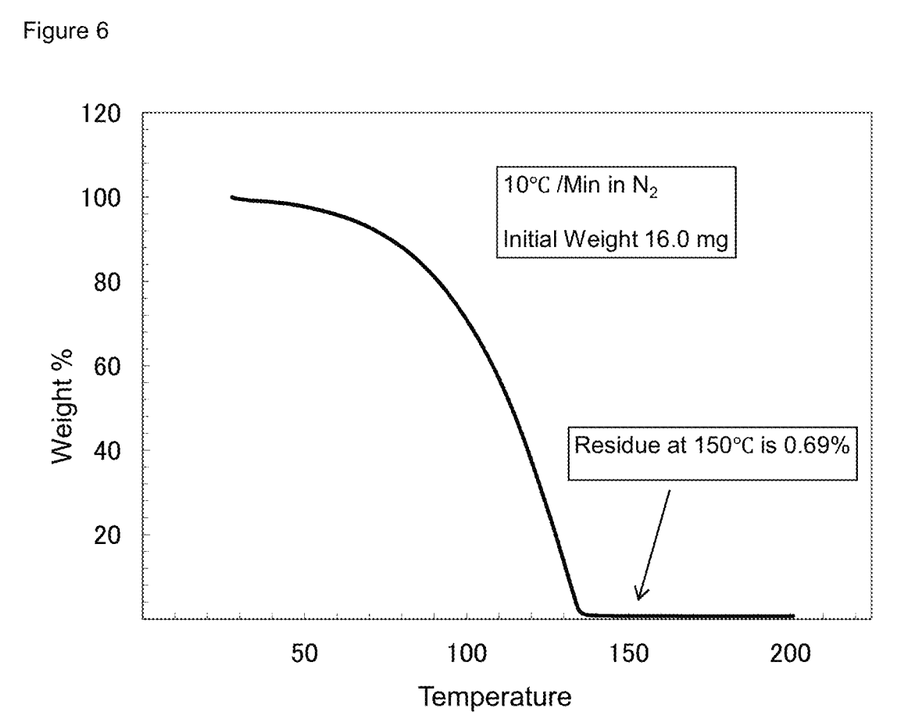
FIG. 6 shows the TGA of $EtMe_2SiC(CO)_4$.
Figure 7:
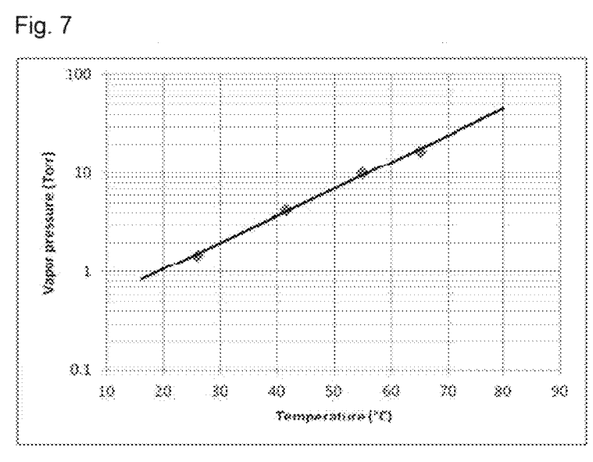
FIG. 7 shows the vapor pressure of $EtMe_2SiC(CO)_4$.

Example 1: Synthesis of $EtMe_2SiCo(CO)_4$ 3 g of $Co_2(CO)_8$ and 40 mL of dry pentane were charged into a 100 mL flask under $N_2$, followed by the addition of 1.7 g of $EtMe_2SiH$. After stirring for 1 hr, pentane and excess $EtMe_2SiH$ were removed under reduced pressure. The liquid product was purified by distillation under reduced pressure. NMR confirmed the product to be $EtMe_2SiCo(CO)_4$. TGA analysis and vapor pressure measurements showed that the material has a good volatility for vapor deposition applications, as shown in FIG. 6 and FIG. 7, respectively.

Figure 8:
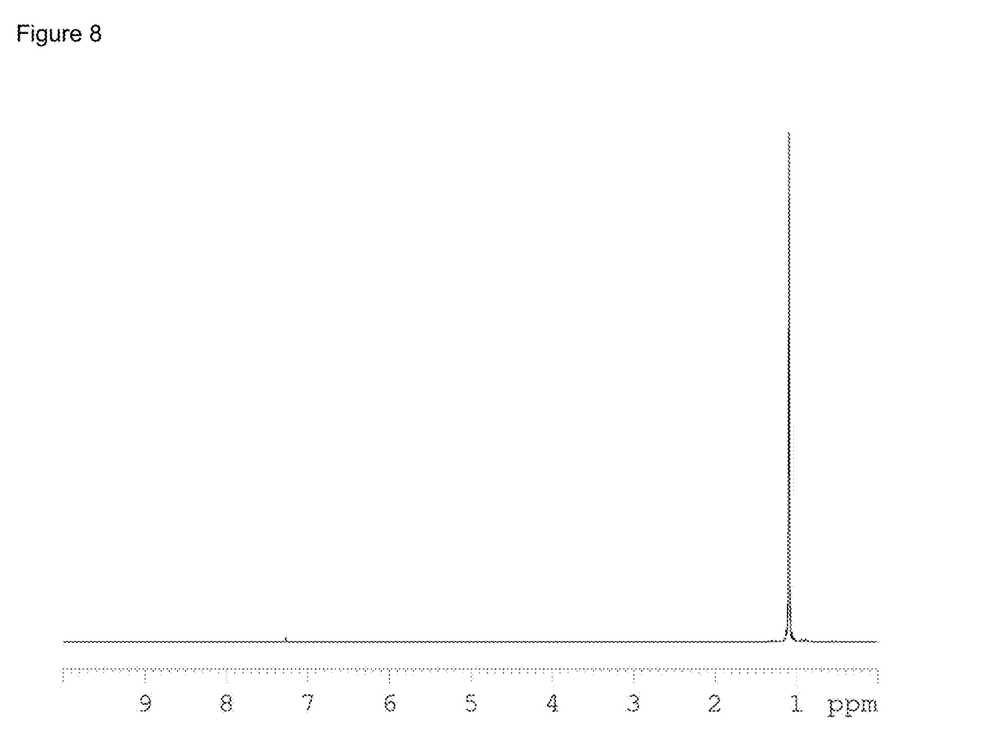
FIG. 8 shows the NMR spectrum of $Et_3SiC(CO)_4$.

Example 2: Synthesis of $Et_3SiCo(CO)_4$ 5 g of $Co_2(CO)$, and 60 mL of dry pentane were charged into a 100 mL flask under $N_2$, followed by the addition of 3.7 g of $Et_3SiH$. After stirring for 1 hr, pentane and excess $Et_3SiH$ were removed under reduced pressure. The liquid product was purified by distillation under reduced pressure. NMR confirmed the product to be $Et_3SiCo(CO)_4$, as shown in FIG. 8.

Figure 9:
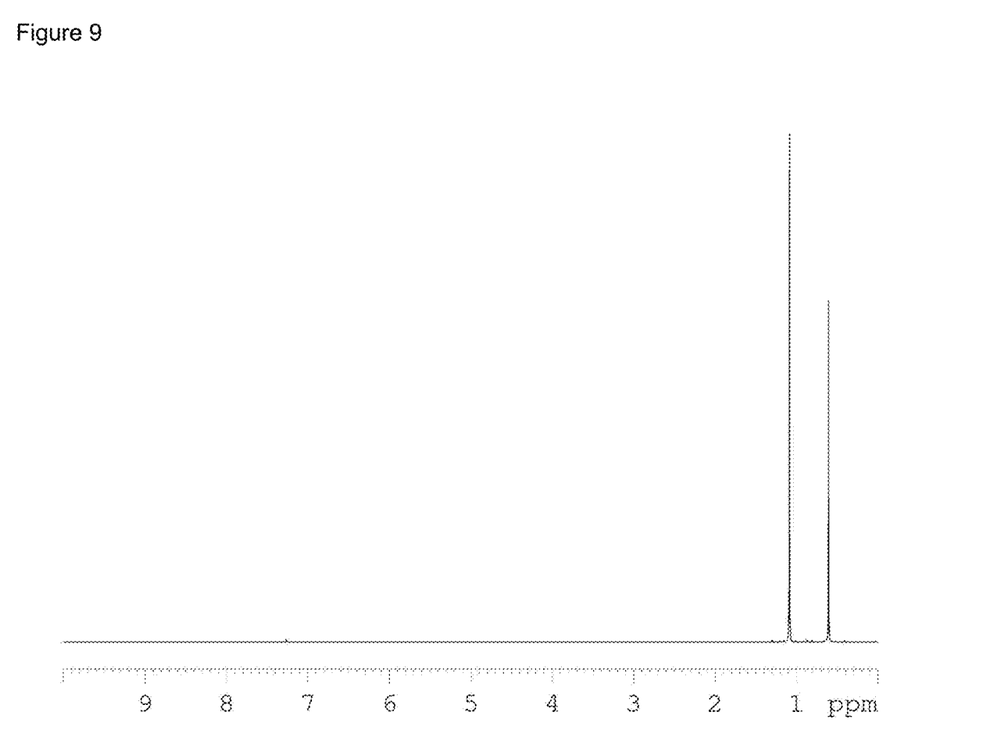
FIG. 9 shows the NMR spectrum of $^tBuMe_2SiCo(CO)_4$.
Figure 10:
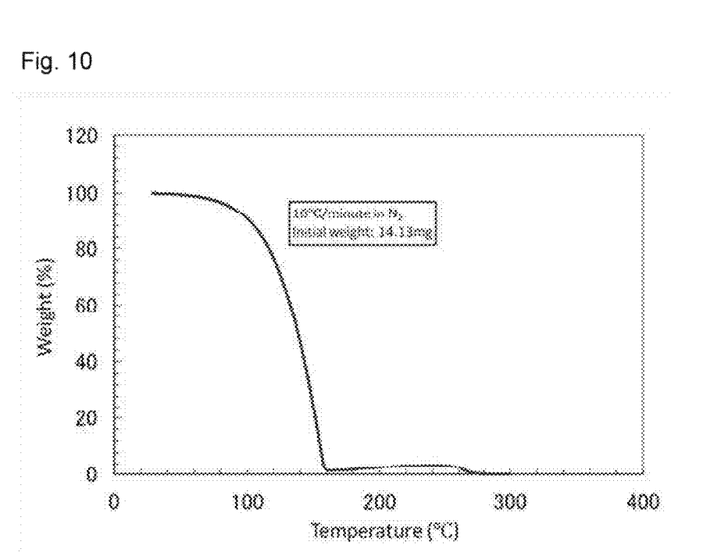
FIG. 10 shows the TGA of $^tBuMe_2SiCo(CO)_4$.
Figure 11:
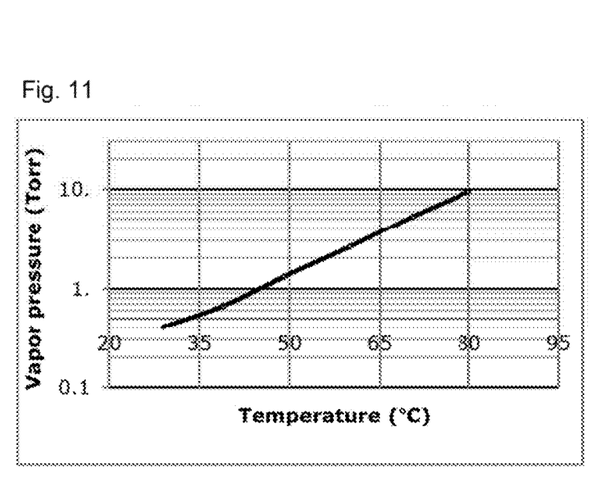
FIG. 11 shows the vapour pressure of $^tBuMe_2SiCo(CO)_4$.

Example 3: Synthesis of $^tBuMe_2SiCo(CO)_4$ 3 g of $CO_2(CO)_B$ and 40 mL of dry pentane were charged into a 100 mL flask under $N_2$, followed by the addition of 2 g of $tBuMe_2SiH$. After stirring for 4 hr, pentane and excess $tBuMe_2SiH$ were removed under reduced pressure. The liquid product was purified by distillation under reduced pressure. As shown in FIG. 9, NMR confirmed the product to be $^tBuMe_2SiCo(CO)_4$. TGA analysis and vapor pressure measurements showed that the material had good volatility for vapor deposition applications, as shown in FIG. 10 and FIG. 11.

Figure 12:
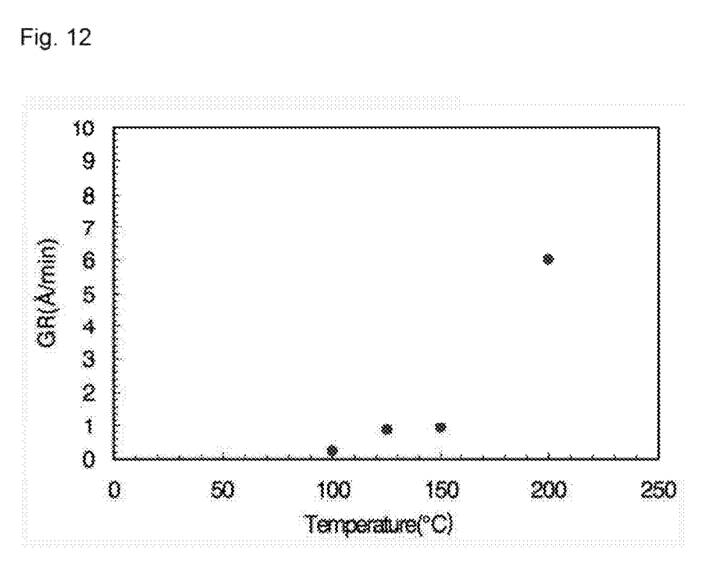
FIG. 12 shows the thermal growth rate as a function of temperature for deposition using $^tBuMe_2SiCo(CO)_4$.

FIG. 12 shows that $^tBuMe_2SiCo(CO)_4$ has good thermal stability up to about 150° C., making it suitable for use in deposition.

Example 4: Synthesis of $(Et_3Si)_2Fe(CO)_4$ 35 g of $Et_3SiH$ and 5 g of $Fe(CO)_{12}$ were charged in a bubbler. The bubbler was then heated at 120° C. for 36 hrs. Excess $Et_3SiH$ was removed under reduced pressure, followed by filtration to collect the product. NMR confirmed the product to be $(Et_3Si)_2Fe(CO)_4$.

Example 5. Synthesis of $Et_3SiMn(CO)_5$ 2.5 g $Mn_2(CO)_{10}$ and 30 g of $Et_3SiH$ were charged in a bubbler. The bubbler was then heated at 170 C for 36 hrs. Excess $Et_3SiH$ was removed under reduced pressure, followed by distillation under reduced pressure to collect the product. NMR confirmed the product to be $Et_3SiMn(CO)_5$.

Example 6. Synthesis of $(DimethylphenylSi)_2W(CO)_4$ 6.73 g of $W(CO)_6$ was suspended in 60 mL of dry dichloromethane. The suspension was cooled in a dry ice/ acetone bath, followed by the addition of 1 mL $Br_2$ diluted in 10 mL dichloromethane. The mixture was stirred for another 20 minutes. Dichloromethane was then pumped off in an ice/water bath to yield $W_2Br_4(CO)_8$.

In another reaction flask, 10 g of $PhMe_2SiH$ was mixed with 60 mL of dimethoxyethane, followed by the addition of 6 g of potassium hydride. The reaction mixture was refluxed for 8 hrs, and then filtered to collect the liquid. The obtained liquid was then mixed with $W_2Br_4(CO)_8$ and stirred for 8 hrs in ice bath. Volatile solvent was pumped off. Sublimation was then carried out to collect $(PhMe_2Si)_2W(CO)_4$.

Figure 13:
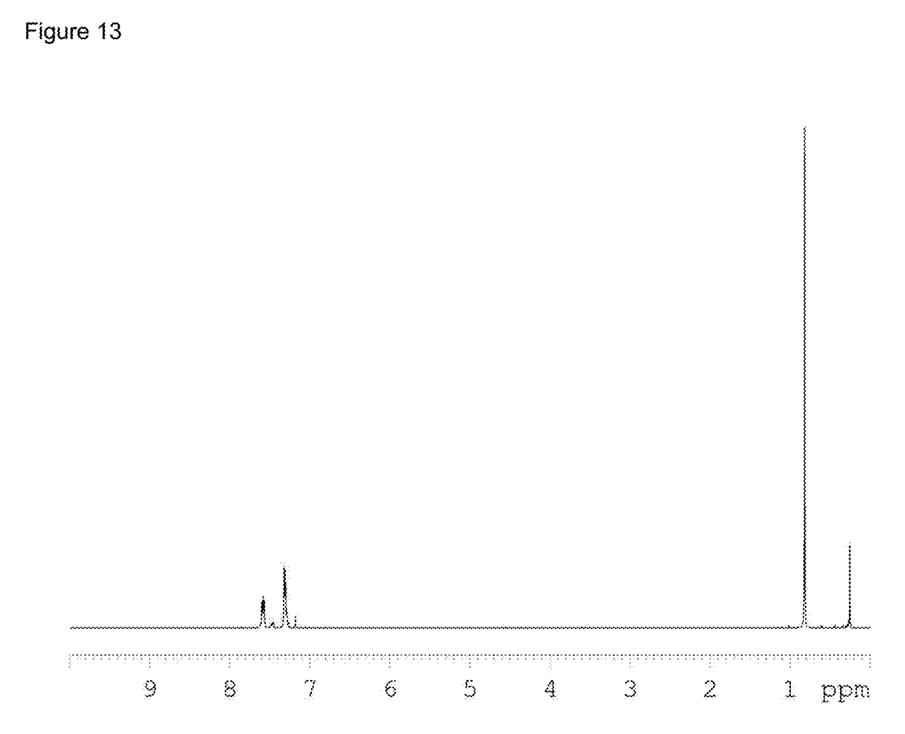
FIG. 13 shows the NMR of $PhMe_2SiCo(CO)_4$.

Example 7: Synthesis of $PhMe_2SiCo(CO)_4$ 5 g of $Co_2(CO)_8$ and 40 mL of dry pentane were charged into a 100 mL flask under $N_2$, followed by the addition of 4.38 g of $PhMe_2SiH$. After stirring for 1 hr, pentane and excess PhMe2SiH were removed under reduced pressure. The liquid product was purified by distillation under reduced pressure. NMR confirmed the product to be $PhMe_2SiCo(CO)_4$, as shown in FIG. 13.

Example 8: Deposition of Co Thin Film Using $EtMe_2SiCo(CO)_4$ Compound and $NH_3$ Gas as Co-reagent $EtMe_2SiCo(CO)_4$ compound in a bubbler was heated at 60° C., while the $NH_3$ gas was at room temperature. The temperature of the substrate holder was 200° C. The carrier gas for Co reagent was Ar containing 5% $H_2$. The flow rate of both was ca. 200 sccm. The pressure in the reaction chamber was 500 mbar. Substrates used were glass slide, Cu slide and TiN slide. Deposition was carried out for 6 minutes. All substrates were coated with shining Co thin film.

Example 9. Deposition of Co Thin Film Using $Et_3SiCo(CO)_4$ Compound and Methanol as Co-Reagent $Et_3SiCo(CO)_4$ compound in a bubbler was heated at 60° C., while methanol was cooled to 0° C. The temperature of the substrate holder was 200° C. The carrier gas for Co reagent was Ar containing 5% $H_2$. The flow rate of both was ca. 200 sccm. The pressure in the reaction chamber was 500 mbar. Substrates used were glass slide, Cu slide and TiN slide. Deposition was carried out for 10 minutes. All substrates were coated with shining Co thin film.

Example 10. Deposition of Fe Thin Film Using $(Et_3Si)_2Fe(CO)_4$ Compound and $NH_3$ as Co-Reagent $(Et_3Si)_2Fe(CO)_4$ compound in a bubbler was heated at 80° C., while the $NH_3$ gas was at room temperature. The temperature of the substrate holder was 250° C. The carrier gas for Co reagent was Ar containing 5% $H_2$. The flow rate of both was ca. 200 sccm. The pressure in the reaction chamber was 500 mbar. Substrates used were glass slide, Cu slide and TiN slide. Deposition was carried out for 10 minutes. Fe deposition was confirmed by EDX Example 11. Deposition of CoO Thin Film Using $EtMe_2SiCo(CO)_4$ Compound and $O_2$ Gas as Co-reagent $EtMe_2SiCo(CO)_4$ compound in bubbler was heated at 60° C. while the methanol was at room temperature. The temperature of the substrate holder was 200° C. The carrier gas for Co reagent was $N_2$. The flow rate of both was ca. 200 sccm. The pressure in the reaction chamber was 500 mbar. Substrates used were glass slide, and TiN slide. Deposition was carried out for 6 minutes. All substrates were coated with CoO thin film. During the deposition air was present in the reactor system, resulting in higher oxygen content in the Co film that was deposited. This shows that CoO can be grown with 02 as co-reagent.

Example 12. Deposition of Co Thin Film Using $^tBuMe_2SiCo(CO)$ Compound and $NH_3/H_2$ Gas Mixture as Co-Reagent $^tBuMe_2SiCo(CO)_4$ compound in a bubbler was heated at 40° C., while the $NH_3/H_2$ gas mixture containing 25% $H_2$ was kept at room temperature. The temperature of the reactor was 200° C. The carrier gas for Co reagent was $N_2$. The flow rate of both was 200 sccm. The pressure in the reaction chamber was 100 Torr. Deposition was carried out for 30 minutes. A resistivity of $6.09 \times 10^{-5}$ μΩcm was achieved.

Figure 14:
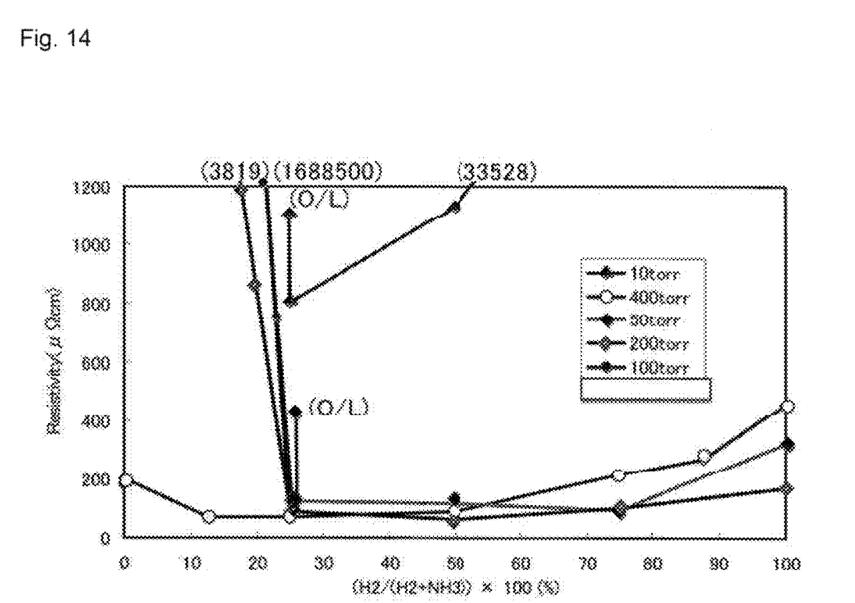
FIG. 14 shows the resistivity of a cobalt film deposited using $^tBuMe_2SiC(CO)_4$.

FIG. 14 shows the conductivity of the cobalt films obtained as a function of hydrogen/ammonia mixture, demonstrating that good quality films with high conductivities can be prepared using a hydrogen/ammonia mixture with greater than about 25% hydrogen.

Figure 15:
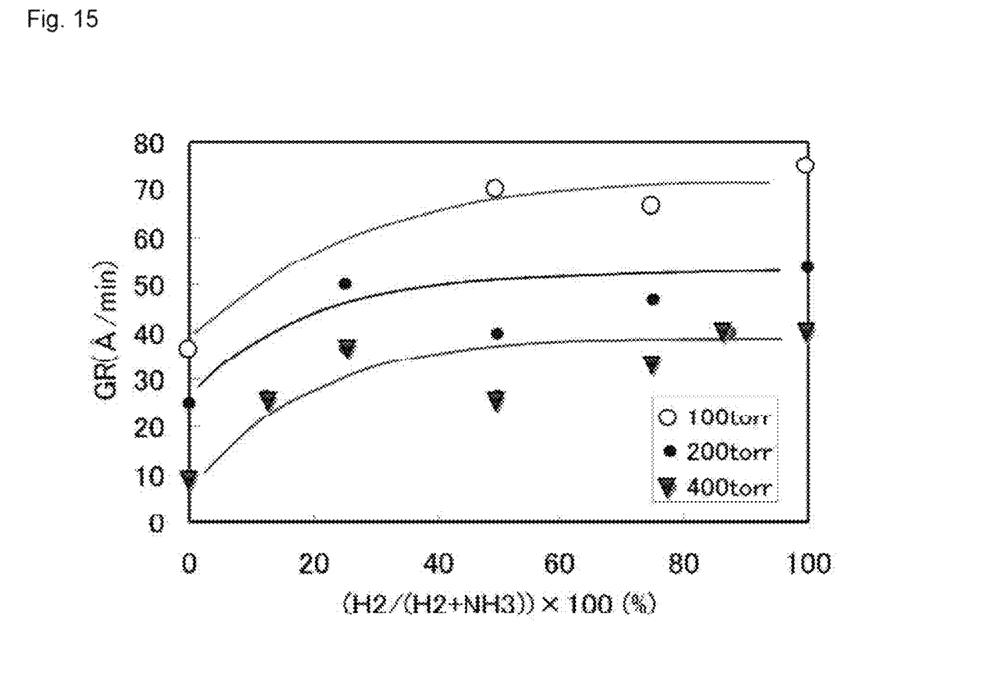
FIG. 15 shows the growth rate as a function of pressure and the hydrogen to ammonia ratio for deposition using $tBuMe_2SiCo(CO)_4$.

FIG. 15 shows that the growth rate flattens out when about 25-80% hydrogen is used with ammonia, confirming the conductivity data from FIG. 14. Film growth stability is observed.

Figure 16:
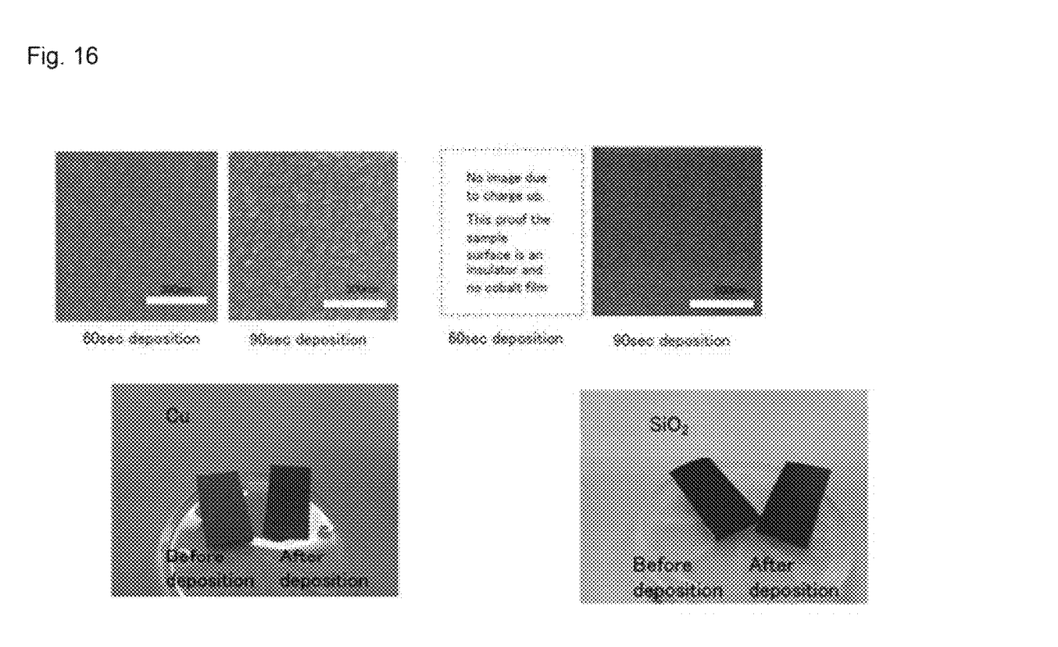
FIG. 16 shows a demonstration of the process of selective deposition using a compound of the invention.

Example 13. Selective Deposition of Co Thin Film on Co Seed Layers Using $EtMe_2SiCo(CO)_4$ Compound and $NH_3$ Gas as Co-Reagent $EtMe_2SiCo(CO)_4$ compound in bubbler was heated at 40° C. while the $NH_3$ gas was at room temperature. The temperature of the substrate holder was 200° C. The carrier gas for Co reagent was $N_2$. The flow rate of both was ca. 200 sccm. The pressure in the reaction chamber was 90 torr. Initially low pressure CVD was carried out to deposit seed layers of Co metal on Cu Substrate. This was then followed with selective ALD growth of cobalt on the seed cobalt layers. During the CVD of cobalt seed, there was induction period on the $SiO_2$ surface compared to Cu which allows for selective deposition of cobalt on copper as compared to silicon oxide, as shown in FIG. 16.

The following reference characters are used in FIG. 4: 1 Inert carrier gas input; 2 Mass flow controller; 3 Valve controlling direct input of inert carrier gas to reaction chamber; 4 Valve controlling input of inert carrier gas to bubbler; 5 Valve controlling input of inert carrier gas containing vaporized precursor to reaction chamber; 6 Bubbler containing compound; 7 Compound; 8 Input of gaseous co-reagent or inert carrier gas for liquid co-reagent; 9 Mass flow controller; 10 Valve controlling direct input of gaseous co-reagent or inert carrier gas; 11 Valve controlling input of inert carrier gas to bubbler; 12 Valve controlling input of inert carrier gas containing vaporized co-reagent to reaction chamber; 13 Bubbler containing co-reagent; 14 Liquid co-reagent; 15 Quartz tube wall of reaction chamber; 16 Substrate; 17 Graphite substrate holder with heater and thermocouple; 18 Heater; 19 Thermocouple; 20 Pressure regulating valve to vacuum pump controlling gas pressure in reaction chamber; and 21 Metal flanges for reaction chamber.

The scope of the claims should not be limited by the illustrated embodiments set forth as examples, but should be given the broadest interpretation consistent with a purposive construction of the claims in view of the description as a whole.

What is claimed is:

1. A method for forming a film by a vapor deposition process, the method comprising:
    a) providing at least one substrate,
    b) delivering to said substrate at least one compound of Formula 1 in the gaseous phase, $(R^1R^2R^3 (Si))-Co(CO)_4$   Formula 1 wherein $R^1$, $R^2$ and $R^3$ are independently selected lower alkyl groups,
    c) simultaneously with or subsequently to step b), delivering to said substrate a co-reagent in the gaseous phase, the co-reagent being lower alcohol, and
    d) removing gaseous reaction products,
    wherein the film is a metal film.

2. The method of claim 1, wherein the compound is selected from the group consisting of $EtMe_2SiCo(CO)_4$, and $^tBuMe_2SiCo(CO)_4$.

3. The method of claim 2, wherein the compound of Formula 1 is $^tBuMe_2SiCo(CO)_4$.

4. The method of claim 1, wherein the co-reagent is methanol.

5. The method of claim 1, wherein the vapor deposition process is chemical vapor deposition.

6. The method of claim 1, wherein the vapor deposition process is atomic layer deposition.

7. A method of selectively depositing a metal-containing film on one or more of a plurality of substrates, the method comprising:
    a) providing at least two substrates comprising different materials, one of said at least two substrates has an affinity for Si and another of said at least two substrates has an affinity for CO,
    b) delivering to said substrates at least one compound of Formula 1 in the gaseous phase $(R^1R^2R^3 (Si))-Co(CO)_4$   Formula 1 wherein $R^1$, $R^2$ and $R^3$ are independently selected lower alkyl groups having from 1 to 4 carbon atoms,
    c) simultaneously with or subsequently to step b), delivering to said at least two substrates at least one co-reagent in the gaseous phase, the at least one co-reagent being selected from ammonia, methanol, oxygen, and a mixture of ammonia and $H_2$, wherein the mixture of ammonia and $H_2$ includes at least 25% $H_2$ as a percentage of the total mixture of ammonia and $H_2$, and
    d) removing gaseous reaction products.

8. The method of claim 7, wherein the one of said at least two substrates is $SiO_2$.

9. The method of claim 8, wherein the compound of Formula 1 is $^tBuMe_2SiCo(CO)_4$.

10. The method of claim 7, wherein the one of said at least two substrates is SiN.

11. The method of claim 10, wherein the compound of Formula 1 is $^tBuMe_2SiCo(CO)_4$.

12. A method of selectively depositing a metal-containing film on one or more of a plurality of substrates, the method comprising:
    a) providing at least two substrates comprising different materials, one of said at least two substrates has an affinity for Si and another of said at least two substrates has an affinity for CO,
    b) delivering to said substrates at least one compound of Formula 1 in the gaseous phase $(R^1R^2R^3 (Si))-Co(CO)_4$   Formula 1 wherein $R^1$, $R^2$ and $R^3$ are independently selected lower alkyl groups having from 1 to 4 carbon atoms,
    c) simultaneously with or subsequently to step b), delivering to said at least two substrates at least one co-reagent in the gaseous phase, the at least one co-reagent being selected from ammonia, methanol, oxygen, and a mixture of ammonia and $H_2$, wherein the mixture of ammonia and $H_2$ includes at least 25% $H_2$ as a percentage of the total mixture of ammonia and $H_2$, and
    d) removing gaseous reaction products,
    wherein the another of said at least two substrates having an affinity for CO is selected from the group consisting of Ni, Pd, Pt, Co, Rh, Ir, Fe, Ru, and Os.

13. The method of claim 12, wherein the metal containing film is Co.

14. The method of claim 13, wherein the compound of Formula 1 is $^tBuMe_2SiCo(CO)_4$.

* * * * *